(12) United States Patent
Gruenwald et al.

(10) Patent No.: US 10,355,191 B2
(45) Date of Patent: Jul. 16, 2019

(54) THERMOELECTRIC HEAT EXCHANGER

(71) Applicant: Mahle International GmbH, Stuttgart (DE)

(72) Inventors: Juergen Gruenwald, Ludwigsburg (DE); Christian Heneka, Karlsruhe (DE)

(73) Assignee: Mahle International GmbH (DE)

( * ) Notice: Subject to any disclaimer, the term of this patent is extended or adjusted under 35 U.S.C. 154(b) by 0 days.

(21) Appl. No.: 15/744,760

(22) PCT Filed: Jun. 17, 2016

(86) PCT No.: PCT/EP2016/064043
§ 371 (c)(1),
(2) Date: Jan. 12, 2018

(87) PCT Pub. No.: WO2017/009000
PCT Pub. Date: Jan. 19, 2017

(65) Prior Publication Data
US 2018/0204995 A1 Jul. 19, 2018

(30) Foreign Application Priority Data
Jul. 15, 2015 (DE) .................. 10 2015 213 295

(51) Int. Cl.
*H01L 35/30* (2006.01)
*H01L 35/34* (2006.01)
(Continued)

(52) U.S. Cl.
CPC .............. *H01L 35/30* (2013.01); *F01N 5/025* (2013.01); *F25B 21/04* (2013.01); *H01L 35/32* (2013.01); *H01L 35/34* (2013.01)

(58) Field of Classification Search
CPC .......... H01L 35/30; H01L 35/34; F01N 5/025
See application file for complete search history.

(56) References Cited

U.S. PATENT DOCUMENTS

| 6,226,994 B1 | 5/2001 | Yamada et al. |
| 9,291,375 B2 | 3/2016 | Brehm et al. |

(Continued)

FOREIGN PATENT DOCUMENTS

| DE | 112005001273 T5 | 4/2007 |
| DE | 102009058673 A1 | 6/2011 |

(Continued)

OTHER PUBLICATIONS

English abstract for JP-2006156818.
English abstract for JP-2000286459.

*Primary Examiner* — Tae-Sik Kang
(74) *Attorney, Agent, or Firm* — Fishman Stewart PLLC

(57) ABSTRACT

A method for producing a Peltier element of a heat exchanger for temperature control of a fluid flowable through a flow chamber may include providing an electrically conductive belt. The method may also include providing the belt with a plurality of p-doped P-semiconductors and a plurality of n-doped N-semiconductors so as to alternate with one another along the belt. The plurality of p-doped P-semiconductors and the plurality of n-doped N-semiconductors respectively may have a side facing away from the flow chamber electrically contacted by a contacting structure that may include a plurality of contact elements. The method may also include separating the belt to produce a plurality of connecting elements of a connecting structure electrically contacting a side of the plurality of p-doped P-semiconductors and the plurality of n-doped N-semiconductors facing towards the flow chamber, respectively.

19 Claims, 3 Drawing Sheets

(51) Int. Cl.
  *F01N 5/02*   (2006.01)
  *F25B 21/04*  (2006.01)
  *H01L 35/32*  (2006.01)

(56) References Cited

U.S. PATENT DOCUMENTS

| | | |
|---|---|---|
| 2007/0220902 A1 | 9/2007 | Matsuoka et al. |
| 2009/0277490 A1* | 11/2009 | Chu ................. H01L 35/32 |
| | | 136/230 |
| 2011/0023930 A1* | 2/2011 | Konig ............... H01L 35/08 |
| | | 136/212 |
| 2016/0056360 A1 | 2/2016 | Cho et al. |

FOREIGN PATENT DOCUMENTS

| | | |
|---|---|---|
| EP | 2282356 A2 | 2/2011 |
| EP | 2518424 A2 | 10/2012 |
| JP | H11-068173 A | 3/1999 |
| JP | 2000286459 A | 10/2000 |
| JP | 2006156818 A | 6/2006 |
| JP | 2010-219255 A | 9/2010 |
| WO | WO-9206570 A1 | 4/1992 |
| WO | WO-2015056855 A1 | 4/2015 |

\* cited by examiner

THERMOELECTRIC HEAT EXCHANGER

CROSS-REFERENCE TO RELATED APPLICATIONS

This application claims priority to International Patent Application No. PCT/EP2016/064043, filed on Jun. 17, 2016, and German Patent Application No. 10 2015 213 295.1, filed on Jul. 15, 2015, the contents of both of which are hereby incorporated by reference in their entirety.

TECHNICAL FIELD

The invention at hand relates to a thermoelectric heat exchanger for controlling the temperature of a fluid, in particular for a motor vehicle, comprising a Peltier element. The invention furthermore relates to such a Peltier element.

BACKGROUND

Common heat exchangers are used to control the temperature of fluids, in particular of gases. Such heat exchangers make it possible hereby to heat and/or to cool the fluid. Such heat exchangers can have temperature-control elements for this purpose.

It is known to provide electrically dissipative heating elements, as such temperature-control elements, which generate dissipative heat when flowing through an electric current. Such a heating element is known from WO 92/06570 A. The heating element is hereby embodied as a PTC resistor or a positive temperature coefficient heating element (PTC heating element) and is used to heat an air flow.

The disadvantage of such dissipative heating elements is that they do not allow for a sufficient heating and/or that the resource consumption thereof is too high, in particular when only few electrical resources are available.

It is also known from the prior art to use thermoelectric temperature-control elements to control the temperature of a fluid. The use of such a thermoelectric heating element in a heat exchanger is known from DE 10 2009 058 673 A1 and from EP 2 518 424 A1. A Peltier element, which, due to a corresponding switching and application of an electrical voltage, has a cold side and a warm side, is hereby used in each case. In addition to the heat transfer between the fluid and another fluid caused by the temperature difference, a corresponding arrangement of the Peltier element makes it possible to realize a heat transfer, which is achieved by means of the Peltier element, so that the total heat transfer is increased. Such Peltier elements have a plurality of differently doped semiconductors, which are interconnected with one another. To avoid a short-circuit between the semiconductors, the semiconductors are electrically insulated on both sides by means of an electrically insulating coating and/or an electrically insulating plate. Such an electrical insulation thereby routinely represents a thermal barrier, which impairs a thermal replacement of the Peltier element. Due to the fact that the electrical insulations are further arranged on the sides of the Peltier element, which are located opposite one another in the heat flow direction, the heat exchange between the Peltier element and the fluid or object, the temperature of which is to be controlled, is made more difficult.

Such Peltier elements are moreover embodied rigidly. During operation of the Peltier element, a temperature difference inside the Peltier element occurs, which leads to thermal stresses inside the Peltier element. These thermal stresses can thereby lead to damages to the electrical insulation of the Peltier element, and to damages to the electrical connections between the semiconductors, which can negatively impact the function of the Peltier element, can in particular lead to the failure of the Peltier element.

SUMMARY

The invention at hand thus deals with the problem of specifying an improved or at least another embodiment, which is in particular characterized by an improved efficiency and/or durability, for a thermoelectric heat exchanger, which has a Peltier element, for controlling the temperature of a fluid as well as for such a Peltier element.

According to the invention, this problem is solved by means of the subject matter of the independent claim(s). Advantageous embodiments are the subject matter of the dependent claims.

The invention at hand is based on the general idea of arranging a conductor, which electrically connects at least one semiconductor of the Peltier element, at least area by area in the flow chamber in the case of a thermoelectric heat exchanger, which has a Peltier element, for controlling the temperature of a fluid, which flows through a flow chamber, so that it is in particular subjected directly to the flowing fluid. The conductor can thus be used to electrically connect the semiconductors as well as for the heat exchange between the fluid and the Peltier element. The result is an improved heat exchange between the fluid and the Peltier element, so that the efficiency of the heat exchanger is improved. The arranging of such a conductor in the flow chamber moreover results in lower thermal stresses and/or an improved reduction of thermal stresses inside the Peltier element, so that corresponding damages to the Peltier element are prevented or at least reduced, and a durability and/or service life of the heat exchanger is thus improved.

According to the idea of the invention, the thermoelectric heat exchanger thus has the flow chamber, through which the fluid, the temperature of which is to be controlled, can flow. The Peltier element serves to control the temperature of the fluid and has a plurality of p-doped P-semiconductors and n-doped N-semiconductors, which are arranged so as to alternate. The electrical connection of the semiconductors is made by means of said conductors, which are realized by means of a connecting structure and a contacting structure. The semiconductors are hereby electrically contacted by the connecting structure on their side facing the flow chamber, and are electrically contacted by the contacting structure on their side facing away from the flow chamber. For electrically contacting the semiconductors, the connecting structure has connecting elements, which in each case electrically contact two such semiconductors and which are electrically insulated against one another. For electrically contacting the semiconductors, the contacting structure has contact elements, which in each case electrically contact two such semiconductors and which are electrically insulated against one another. Provision is thereby made according to the invention for at least one such connecting element to be arranged in the flow chamber.

The semiconductors of the Peltier element are preferably connected in series by means of the connecting structure and the contacting structure. It is also conceivable, however, to also connect at least two of the semiconductors in parallel.

With the solution according to the invention, an electrically insulating layer and/or electrically insulating plate on the side of the Peltier element, which faces the flow chamber, can be forgone, wherein preferred alternatives are embodied without such an electrically insulating layer or plate, respectively. As a result, a thermal barrier between the Peltier element and the fluid, which is caused by such an electrically insulating layer or plate, respectively, is significantly reduced, thus resulting in an improved heat exchange between the fluid and the Peltier element and thus in an improved efficiency of the heat exchanger. In addition, the avoidance of such insulating layers leads to a simplified and more cost-efficient production of the Peltier element or of the heat exchanger, respectively. As a result, the weight of the Peltier element or of the heat exchanger, respectively, can furthermore be reduced.

The heat exchanger according to the invention can be used in any application to control the temperature of such a fluid. It is in particular conceivable to use the heat exchanger in a motor vehicle, so as to control the temperature of such a fluid, which flows through the motor vehicle. It is in particular conceivable to use the heat exchanger as heater, for example additional heater, to control the temperature of the fluid. The fluid can thereby in particular be air, which is supplied to an interior of the motor vehicle. As a result, the heat exchanger is used as an air-conditioning system of the motor vehicle or as a part of such an air-conditioning system.

Advantageously, the fluid, the temperature of which is to be controlled, is electrically non-conductive. For this purpose, the fluid, the temperature of which is to be controlled, if it is gaseous, in particular the air, the temperature of which is to be controlled, should not exceed a predetermined moisture content. To limit the moisture of the fluid, it is thus conceivable to equip the heat exchanger with a dehumidification device, which dehumidifies the fluid upstream of the Peltier element.

It goes without saying that the temperature of a liquid, which flows through the flow chamber, can also be controlled by means of the heat exchanger according to the invention, in particular if the liquid is electrically non-conductive or if the liquid does not exceed a predetermined electrical conductivity, respectively.

The connecting elements and at least one of the corresponding semiconductors are preferably fastened to one another. Alternatives, in the case of which the respective connecting element is fastened to the two corresponding semiconductors, are advantageous thereby. The fastening is advantageously realized by soldering the connecting element to at least one of the corresponding semiconductors.

Preferred alternatives provide that at least one such connecting element is arranged directly in the flow chamber. This means in particular that the connecting element does not have an additional electrical insulation at least in the flow chamber and/or is not surrounded by an additional electrical insulation. This can lead to a direct contact and heat exchange between the connecting element and the fluid, whereby the efficiency of the heat exchanger is further improved. It is particularly preferred hereby, when the connecting element is in heat-exchanging contact with the fluid as well as with the corresponding semiconductors.

In the case of preferred embodiments, at least one such connecting element is subjected to the flow of the fluid, which flows through the flow chamber. This means that the fluid flows along the connecting element and/or around the connecting element during the operation of the heat exchanger. The heat exchange between the fluid and the connecting element and thus between the fluid and the Peltier element is thus improved and the efficiency of the heat exchanger is thus increased.

It is conceivable, on principle, to only use the Peltier element to control the temperature of the fluid.

Embodiments, in the case of which the heat exchanger has a fluid channel, through which a temperature-control fluid can flow, are also conceivable, wherein the fluid channel is fluidically separated from the flow chamber. In addition, the fluid channel is arranged on the side of the semiconductors, which face away from the flow chamber and which are electrically insulated against the temperature-control fluid. The temperature-control fluid is thereby also used to control the temperature of the fluid. It is in particular conceivable to use the temperature-control fluid in addition to the Peltier element to control the temperature of the fluid.

It is conceivable for example to realize the side of the Peltier element, which faces the fluid channel, as a cold side of the Peltier element. As a result, the side of the Peltier element, which faces the flow chamber, is a warm side of the Peltier element, so that the total heat transfer to the fluid consists of the heat transfer of the temperature-control fluid and of the Peltier element. The heat exchanger is hereby preferably used to heat the fluid. The cold side and the warm side of the Peltier element can be realized by applying a corresponding electrical voltage to the Peltier element. A reversal of the cold side and of the warm side of the Peltier element can be realized hereby by means of a different, in particular reversed application, of the electrical voltage to the Peltier element, in particular in order to cool the fluid.

The temperature-control fluid can be any fluid. The temperature-control fluid can in particular be a liquid. When using the heat exchanger in a motor vehicle, the temperature-control fluid can in particular be coolant of the motor vehicle, which is used in the heat exchanger to heat the fluid and is cooled hereby.

On principle, the fluid channel can run in any way, provided that a heat exchange is possible between the fluid and the temperature-control fluid, in particular via the Peltier element. It is in particular conceivable that the fluid channel runs along the flow chamber.

Advantageous embodiments provide for at least one such connecting element to protrude into the flow chamber. This means in particular that the connecting element has at least one section, which protrudes from at least one of the corresponding semiconductors in the flow chamber. In particular a surface of the connecting element is hereby increased for exchanging heat with the fluid, and the heat exchange with the fluid is thus improved.

It is additionally conceivable that the fluid, the temperature of which is to be controlled, can flow through at least one such connecting element. A heat exchange between the connecting element and the fluid can also be improved hereby, and the efficiency of the heat exchanger can thus be increased.

In the case of preferred embodiments, at least one such connecting element is embodied as a heat exchanger element between the fluid and the corresponding semiconductors. This means in particular that the connecting structure of a heat exchange structure can for example be a rib structure, by means of which an electrical connection between the semiconductors as well as a heat exchange between the semiconductors and the fluid takes place. The components of the heat exchanger can be reduced hereby, so that the heat exchanger as a whole can be produced more easily and/or more cost-efficiently. In addition, the heat exchange between the Peltier element and the fluid is improved, and the efficiency of the heat exchanger is thus increased.

On principle, the respective connecting element can have any form, provided that it electrically connects two such semiconductors and is at least partially arranged in the flow chamber.

It is also conceivable to embody at least one such connecting element as a rib, which protrudes into the flow chamber. The heat exchange between the connecting element and the fluid is improved hereby, and the efficiency of the heat exchanger is thus increased.

Preferred embodiments provide for at least one such connecting element to abut flat on at least one of the corresponding semiconductors. The heat-transferring surface between the connecting element and the at least one corresponding semiconductor is thus increased, and the heat exchange is thus improved. The result is an increased efficiency of the heat exchanger. Advantageously, the flat abutment of the connecting element on at least one of the corresponding semiconductors is realized on the side of the at least one semiconductor, which faces the flow chamber. This means that the connecting element abuts flat on the at least one semiconductor on the side of the at least one semiconductor, which faces the flow chamber.

The electrical insulation of the connecting elements against one another can be realized in any way.

It is conceivable to arrange two such connecting elements so as to be spaced apart from one another, in order to electrically insulate them against one another. The spaced-apart arrangement of the connecting elements further has the advantage that the connecting elements can be moved relative to one another, so that they can in particular reduce thermal stresses. Corresponding damages to the Peltier element are thus avoided or at least reduced hereby, and the durability of the heat exchanger is thus improved.

It is also conceivable to electrically insulate at least two such connecting elements against one another via an electrically insulating insulating section, which mechanically connects the connecting elements to one another. This means that such an insulating section, which mechanically connects and electrically insulates the connecting elements, is arranged between the connecting elements.

Advantageous alternatives thereby provide for the insulating section to be embodied elastically in order to compensate thermal stresses. The durability of the heat exchanger can also be increased hereby.

On principle, the insulating section can be made of any material, provided that it electrically insulates the corresponding connecting elements. It is in particular conceivable to make such an insulating section of plastic, in particular of a polymer. The respective insulating section and thus the heat exchanger can hereby be produced in a simple and cost-efficient manner. In addition to the electrical insulation, it is additionally possible to realize said elastic embodiment of the insulating section for the compensation of thermal stresses.

It is advantageous, when at least one such connecting element is embodied elastically for compensating thermal stresses. The elastic embodiment of the connecting element can thereby be realized by means of a corresponding material selection of the connecting element and/or by means of a corresponding form of the connecting element.

On principle, the respective connecting element can be made of any material, provided that it electrically connects two such semiconductors. The connecting element is preferably made of a metal or metal-containing material. A sufficient electrical conductivity of the connecting element as well as an improved heat exchange of the connecting element is at hand hereby.

It is in particular conceivable to produce at least one such connecting element of a sheet metal and to thus realize it as a sheet metal part. A simple and cost-efficient production of the Peltier element is thus possible.

It is preferred, when at least two such connecting elements are embodied as identical parts, so as to simplify the production of the heat exchanger and/or to allow for a cost-efficient production of the heat exchanger.

The heat exchange between the temperature-control fluid or the fluid channel, respectively, and the Peltier element can also be realized via at least one such contact element. It is in particular conceivable to arrange at least one such contact element analogously to at least one such connecting element in the fluid channel, thus resulting in an in particular direct heat exchange between the contact element and the temperature-control fluid. It is advantageous hereby to use an electrically non-conductive temperature-control fluid. It is in particular conceivable hereby to embody the connecting elements and the contact elements as identical parts.

If the temperature-control fluid is not electrically conductive, an electrical insulation of the semiconductors against the temperature-control fluid is not absolutely necessary. If the temperature-control fluid is electrically conductive, the semiconductors are preferably insulated against the temperature-control fluid.

The same applies for the fluid channel. This means that the semiconductors are preferably insulated against the fluid channel, when the fluid channel is made of an electrically conductive material. In contrast, such an insulation can be forgone, when the fluid channel is made of an electrically non-conductive material or an electrically insulating material, respectively.

The electrical insulation of the temperature-control fluid against the semiconductors can be realized in any way. It is conceivable, for example, to produce the fluid channel from an electrically insulating material, for example of plastic.

In the alternative or in addition, it is conceivable to arrange an electrically insulating insulating layer between at least one such semiconductor and the fluid channel, in particular between at least one such contact element and the fluid channel. The use of such an insulating layer allows the use of such a fluid channel, which is produced so as to be electrically conductive, in particular of a metal. The use of a metallic or metal-containing material, respectively, for the fluid channel, hereby increases the heat exchange between the temperature-control fluid and the at least one contact element, whereby the efficiency of the heat exchanger is increased.

Advantageous alternatives provide for at least one such contact element to be arranged on the side of the fluid channel, which faces the flow chamber, and to be fastened to the fluid channel. Such a fastening can thereby be embodied rigidly, in particular because the compensation of thermal stresses can be realized by the connecting structure.

The insulating layer between the contact element and the fluid channel can be made of any material. The insulating layer can in particular be a dielectric, preferably a ceramic. The ceramic is thereby designed in such a way that it ensures a sufficient heat exchange between the fluid channel or the temperature-control fluid, respectively, and the Peltier element.

It goes without saying that the heat exchanger can also have two or a plurality of such Peltier elements. It is in particular conceivable to arrange two such Peltier elements opposite one another, wherein at least one of the Peltier elements has such a connecting structure comprising at least one such connecting element, which is arranged in the flow chamber. Embodiments, in the case of which at least two such Peltier elements are arranged next to one another, can also be considered.

It is also conceivable to provide the heat exchanger with two such fluid channels, which are located opposite one another and through which such a temperature-control fluid, in particular the same temperature-control fluid, flows.

If the heat exchanger has two or a plurality of such Peltier elements, it is possible to electrically connect two such Peltier elements, in particular to connect them in series.

It goes without saying that at least one such semiconductor of the Peltier element can have two or a plurality of semiconductor elements, which are doped identically. This means that at least one such P-semiconductor can have two or a plurality of p-doped P-semiconductor elements. At least one such N-semiconductor can accordingly have at least two n-doped N-semiconductor elements.

It further goes without saying that, in addition to the heat exchanger, such a Peltier element of the heat exchanger, which has such a connecting structure comprising at least one such connecting element, which can be arranged in the flow chamber of the corresponding heat exchanger, also belongs to the subject matter of this invention.

Further important features and advantages of the invention follow from the subclaims, from the drawings and from the corresponding figure description by means of the drawings.

It goes without saying that the above-mentioned features and the features, which will be described below, cannot only be used in the respective specified combination, but also in other combinations or alone, without leaving the scope of the invention at hand.

Preferred exemplary embodiments of the invention are illustrated in the drawings and will be described in more detail in the description below, whereby identical reference numerals refer to identical or similar or functionally identical components.

BRIEF DESCRIPTION OF THE DRAWINGS

In each case schematically.

DETAILED DESCRIPTION

Figure 1:
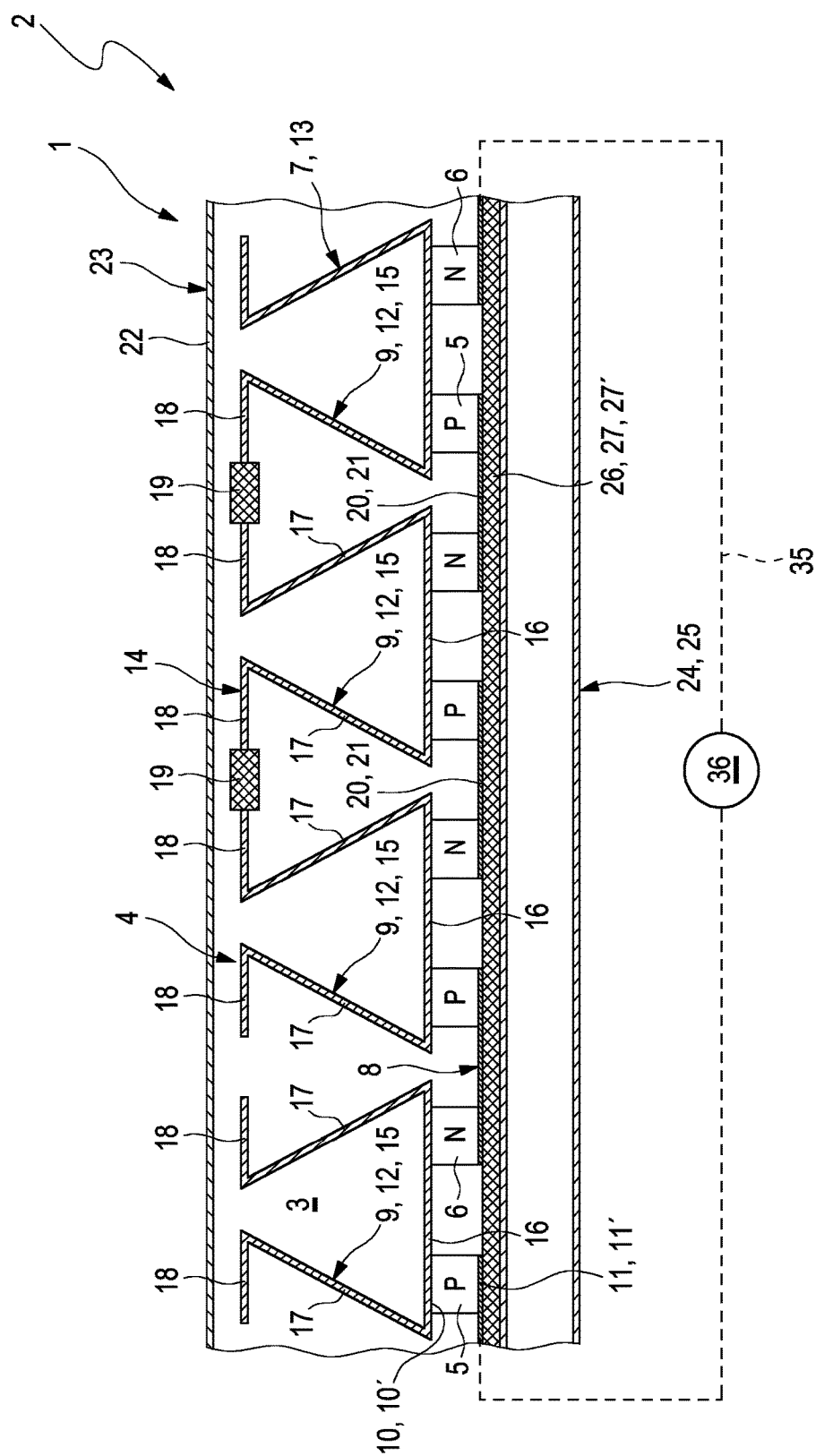
FIG. 1 shows a section through a thermoelectric heat exchanger.

A thermoelectric heat exchanger 1 of an otherwise non-illustrated motor vehicle 2, is illustrated in FIG. 1. The heat exchanger 1 has a flow chamber 3, through which a fluid can flow. The heat exchanger 1 moreover has a Peltier element 4, which has a plurality of p-doped P-semiconductors 5 and n-doped N-semiconductors 6, which are arranged so as to alternate along the flow chamber 3. On their side facing the flow chamber 3, the semiconductors 5, 6 are electrically contacted with one another by means of a connecting structure 7 and by means of a contacting structure 8 on their side, which faces away from the flow chamber 3, and are thus connected in series. For this purpose, the connecting structure 7 has a plurality of connecting elements 9, wherein the respective connecting element 9 electrically contacts such a P-semiconductor 5 with the adjacent N-semiconductor 6. The connecting elements 9 are thereby electrically insulated against one another. The connecting elements 9, which electrically connect the corresponding semiconductors 5, 6, are further arranged in the flow chamber 3. This results in a heat exchange between the connecting elements 9 and the fluid, which flows through the flow chamber 3, so that a temperature control of the fluid by means of the Peltier element 4 is improved, and the efficiency of the heat exchanger 1 is increased.

In the shown example, the sides of the semiconductors 5, 6, which face the flow chamber 3, form a first temperature side 10 of the Peltier element 4, whereas the sides of the semiconductors 5, 6, which face away from the flow chamber 3, form a second temperature side 11 of the Peltier element 4. By correspondingly applying an electrical voltage to the Peltier element 4, as it is illustrated by means of dashes in an exemplary manner in FIG. 1 with electrical connections 35 and a voltage source 36, the first temperature side 10 hereby corresponds to a warm side 10' of the Peltier element 4, while the second temperature side 11 corresponds to a cold side 11' of the Peltier element 4. This means that the warm side 10' of the Peltier element 4 has a higher temperature than the cold side 11' during the operation of the Peltier element 4. The fluid, which flows through the flow chamber 3, can thus be heated by means of the Peltier element 4. In the case of a reversed application of the electrical voltage, it is also conceivable to reverse the cold side 11' and the warm side 10' in such a way that the cold side 11' faces the flow chamber 3 and that the fluid, which flows through the flow chamber 3, is thus cooled.

The connecting elements 9 are in heat-transferring connection with the corresponding semiconductors 5, 6, so that, on the one hand, they exchange heat with the fluid, which flows through the flow chamber 3, and, on the other hand, with the corresponding semiconductors 5, 6. This results in an improved heat exchange between the Peltier element 4 and the fluid, in particular because an electrical insulation of the Peltier element 4 on the side of the Peltier element 4, which faces the flow chamber 3, and thus a corresponding thermal barrier, can be forgone.

In the shown exemplary embodiment, the respective connecting element 9 is embodied in the manner of a rib 12, which provides an enlarged surface for the heat exchange with the fluid. This means that the connecting structure 7 is embodied as a rib structure 13. The connecting structure 7 is further made of a metallic material, in particular of a sheet metal 14, in order to reduce the production costs of the heat exchanger 1. In addition, the connecting elements 9 do not have an electrically insulating coating, so that they are in direct contact with the fluid and are accordingly embodied as heat exchange elements 15. This thus results in a direct heat exchange between the connecting elements 9 and the fluid, whereby the efficiency of the heat exchanger 1 is increased.

In the shown example and in the shown view, the respective connecting element 9 is embodied symmetrically and has a base side 16, from which legs 17, which lean towards one another on opposite sides, protrude, and from which, in turn, feet 18, which run parallel to the base side 16 and which are directed away from one another, protrude. As a whole, this results in an omega-like shape of the respective connecting element 9. The respective connecting element 9 thereby abuts flat on both corresponding semiconductors 5, 6 via the base side 16. A surface for the heat exchange between the connecting element 9 and the corresponding semiconductors 5, 6 is thus increased. The heat exchange between the semiconductors 5, 6 and the connecting elements 9 and thus between the Peltier element 4 and the fluid is thus improved.

In the shown example, the electrical insulation of the connecting elements 9 against one another is illustrated in two ways. Adjacent connecting elements 9 can thereby be arranged completely spaced apart and can thus be electrically insulated against one another. For this purpose, the connecting structure 7 is interrupted in the area of the feet 18. In the alternative or in addition, an insulating section 19, which electrically insulates and mechanically connects the connecting elements 9, can be arranged between adjacent connecting elements 9. Two such insulating sections 19, which in each case electrically insulate and mechanically connect two adjacent connecting elements 9, can thereby be seen in FIG. 1. In the shown example, the insulating sections 19 are arranged between adjacent feet 18 of the adjacent connecting elements 9 and mechanically connect these feet 18. The insulating sections 19 are advantageously made of plastic, in particular of a polymer.

The fluid, which flows through the flow chamber 3, is preferably such a fluid, which is electrically non-conductive. If it is gaseous, the fluid should thereby not exceed a predetermined moisture content. To limit the moisture of the fluid, the heat exchanger 1 can have a dehumidification device, which is not shown here and which is arranged in flow direction of the fluid upstream of the Peltier element 4, for dehumidifying the fluid.

Due to their shape, the connecting elements 9 are arranged in the flow chamber 3 and protrude into the flow chamber 3. In addition, the fluid can flow through the connecting elements 9. The fluid hereby flows against and/or around a larger surface of the respective connecting element 9, thus resulting in an improved heat exchange between the connecting elements 9 and the fluid.

The connecting structure 7, in particular the connecting elements 9, are embodied elastically, so as to reduce thermal stresses inside the Peltier element 4. The elastic embodiment of the connecting elements 9 is hereby provided by the correspondingly spaced-apart arrangement of the connecting elements 9 and/or their shape. In addition, the insulating sections 19 for reducing thermal stresses are embodied elastically. As a whole, a relative movement between the connecting elements 9 is possible hereby, so as to reduce said thermal stresses.

The connecting elements 9 are fastened to the corresponding semiconductors 5, 6. In the shown example, the fastening is realized via the base sides 16 and can be embodied rigidly, because the thermal compensation can take place above the legs 17 or feet 18, respectively, of the connecting elements 9. It is in particular conceivable hereby to solder the connecting elements 9 to the corresponding semiconductors 5.

The contact structure 8 for electrically contacting the semiconductors 5, 6 on the side, which faces away from the flow chamber 3, has a plurality of contact elements 20, wherein the respective contact element 20 electrically contacts such an N-semiconductor 6 with such a P-semiconductor 5. The contact elements 20 are thereby arranged so as to be spaced apart from one another and are thus electrically insulated against one another. In the shown example, the contact elements 20 are embodied as conductor bridges 21, which run in a flat manner and which are made of a metallic or metal-containing material and which extend in a flat manner. The contact elements 20 are further soldered to the corresponding semiconductors 5, 6.

On the side of the feet 18, which faces away from the contacting structure 8, the flow chamber 3 is defined by a wall 22, which can be part of a housing 23.

The heat exchanger 1 has a fluid channel 24, which runs along the flow chamber 3 and which is arranged on the side of the Peltier element 4, which faces away from the wall 22. A temperature-control fluid, in particular coolant of the motor vehicle 2, can flow through the fluid channel 24. The temperature-control fluid for controlling the temperature of the fluid, which flows through the flow chamber 3, is used thereby. In addition to the heat exchange between the temperature-control fluid and the fluid, it is thereby possible to realize a heat exchange by means of the Peltier element 4, and to thus "pump the heat. The Peltier element 4 and the temperature-control fluid are thereby preferably used to heat the fluid. The cold side 11' of the Peltier element 4 thereby obtains the required heat from the temperature-control fluid and transfers this heat to the fluid to an increased extent, due to the Peltier effect, whereby said "pumping" of the heat is realized. For this purpose, the temperature-control fluid preferably has a higher temperature than the fluid.

In the shown exemplary embodiment, the fluid channel 24 is embodied as a pipe 25. The fluid channel 24 and the flow chamber 3 are thereby separated fluidically. The pipe 25 is made of a metallic or metal-containing material and is thus electrically conductive. The Peltier element 4, in particular the semiconductors 5, 6, are electrically insulated from the fluid channel 24. For this purpose, provision is made between the semiconductors 5, 6 or the contact elements 20, respectively, and the fluid channel 24 for an electrically insulating insulating layer 26. It is in particular conceivable to embody the insulating layer 26 as an insulating plate 27, in particular a ceramic plate 27'.

The insulating layer 26 and the Peltier element 4, in particular the contacting structure 8, are fastened to one another via the contact elements 20, in particular adhered to one another. In addition, the insulating layer 26 is mechanically connected to the fluid channel 24, in particular attached to the fluid channel 24. The Peltier element 4 is thus fastened to the fluid channel 24.

It is also conceivable to produce the fluid channel 24, in particular the pipe 25, from an electrically insulating material, for example plastic. The insulating layer 26 can be forgone in this case.

Figure 2:
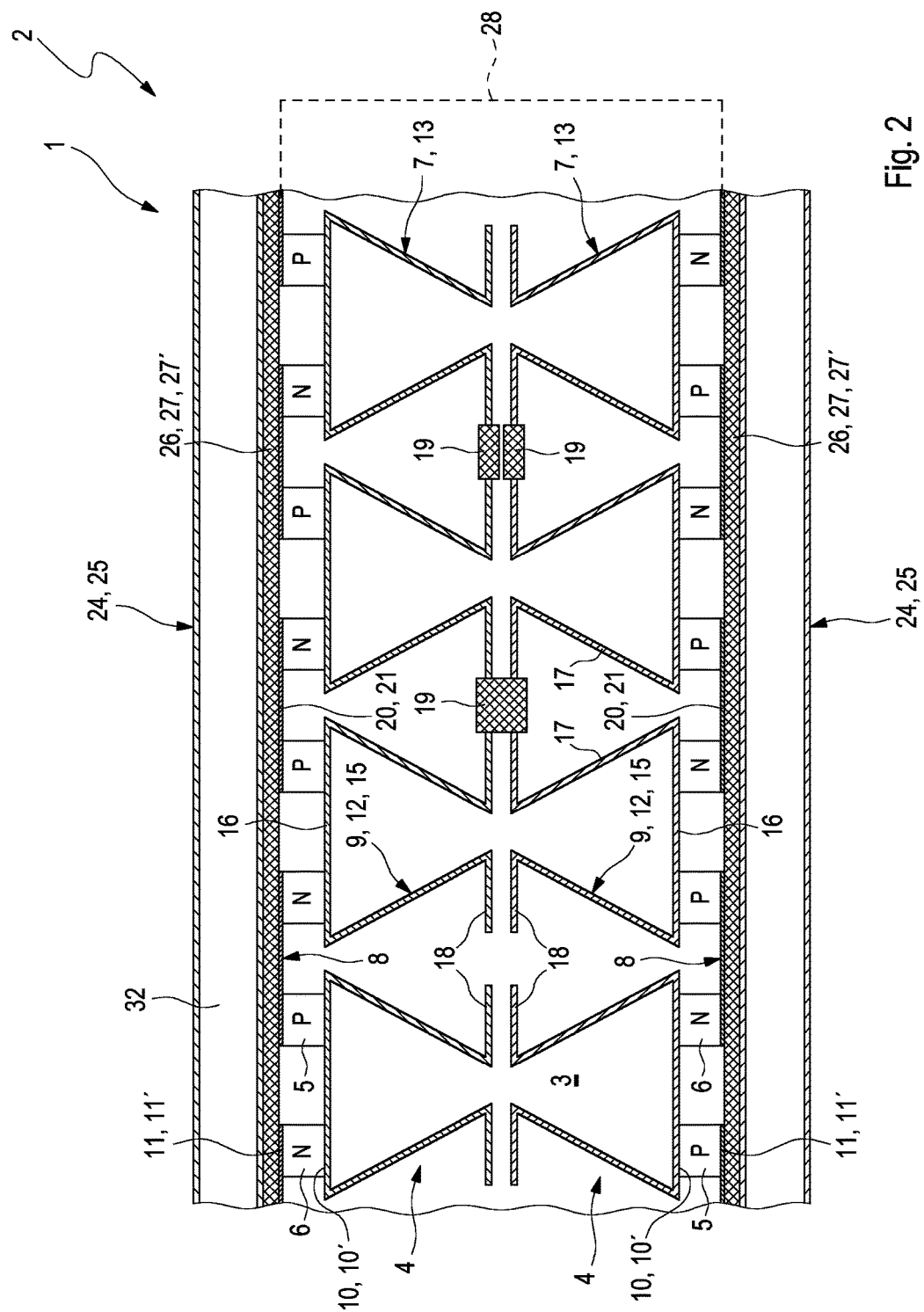
FIG. 2 shows the section from FIG. 1 in the case of a different exemplary embodiment of the heat exchanger.

FIG. 2 shows a different exemplary embodiment of the heat exchanger 1. The heat exchanger 1 shown in FIG. 2 has two such Peltier elements 4, which are arranged so as to be located symmetrically opposite one another. The respective Peltier element 4 shown in FIG. 2 thereby substantially corresponds to the Peltier element 4 from FIG. 1. The Peltier elements 4 are arranged so as to be located opposite one another in such a way that the feet 18 of the corresponding connecting elements 9 of the connecting structures 7 are located opposite one another. The flow chamber 3 is thereby defined by such a fluid channel 24 or such an insulating layer 26, respectively, on opposite sides. This means that the heat exchanger 1 in FIG. 2 has two such fluid channels 24, which are located opposite one another, and through which a temperature-control fluid, in particular the same temperature-control fluid, for example coolant of the corresponding motor vehicle 2, flows in each case. In the shown example, heat is extracted from the respective temperature-control fluid by means of the Peltier elements 4 and is pumped to a higher level and is supplied to the fluid.

The connecting elements 9 of the connecting structures 7 are electrically insulated against one another. This occurs by means of a spaced-apart arrangement of the connecting elements 9 of the connecting structures 7. In the alternative or in addition, provision can be made between the connecting elements for such an insulating section 19. It is conceivable thereby, as illustrated in the center in FIG. 2, to electrically insulate adjacent connecting elements 9 of both Peltier elements 4 via such a common insulating section 19. In the case of connecting elements 9 of the Peltier elements 4, which are arranged adjacently, it is also conceivable to provide a separate such insulating section 19 in each case.

As suggested by means of a dashed line 28, the Peltier elements 4 can be connected in series, wherein an N-semiconductor 6 of the one Peltier element 4 is in electrical contact with a P-semiconductor 5 of the other Peltier element 4 in the shown example for this purpose.

Figure 3:
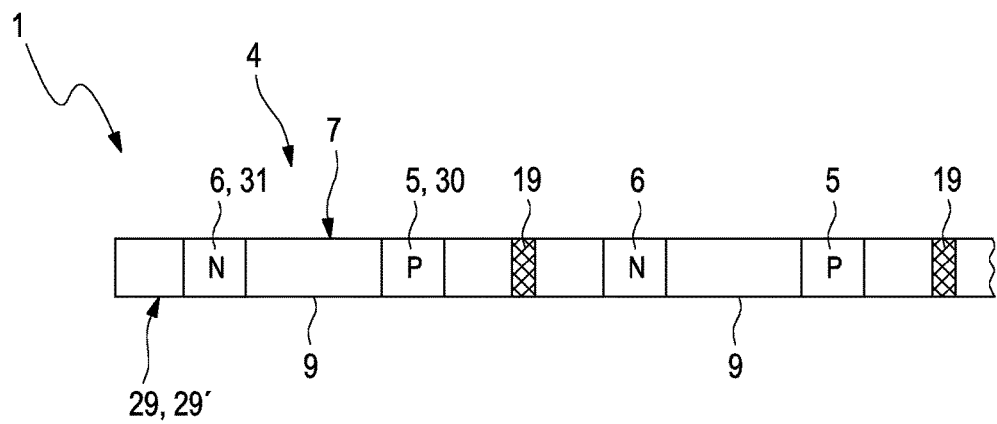
FIG. 3 shows a section through a Peltier element of the heat exchanger.

FIG. 3 shows a section through such a Peltier element 4, wherein only the semiconductors 5, 6 and the connecting structure 7 can be seen. It can be seen that such an N-semiconductor 6 and such a P-semiconductor 5 is assigned to the respective connecting element 9. It is conceivable hereby to produce the connecting structure 7 or the connecting elements 9, respectively, from a belt 29, in particular of an endless belt 29', wherein said belt 29 is equipped with the semiconductors 5, 6 in corresponding sections and is separated into the respective connecting elements 9. In the areas of the separation, provision is subsequently made for such an insulating section 19. A forming of the belt 29 and a separation of the belt 29, for example in the exemplary embodiments shown in FIGS. 1 and 2, can take place subsequently.

It is also conceivable, however, to provide the connecting elements 9 with the corresponding semiconductors 5, 6 after the separation and forming of the endless belt 29'.

To realize the electrical serial arrangement of the semiconductors 5, 6, a corresponding electrical interruption of the belt 29 can take place. For this purpose, the belt 29 can initially be provided with non-visible recesses or interruptions. Said insulating sections can then optionally be provided in these interruptions.

The provision of the semiconductors 5, 6 hereby preferably takes place by the soldering of the semiconductors 5, 6 with the belt 29 or the connecting elements 9, respectively. It is also conceivable to initially apply the semiconductors 5, 6 to a non-illustrated carrier, in particular to coat the carrier with the semiconductors 5, 6, and to connect the carriers, which are provided with the semiconductors 5, 6, to the belt 29 or to the corresponding connecting elements 9, respectively.

In the exemplary embodiment shown in FIG. 3, the respective semiconductor 5, 6 has a single semiconductor element 30, 31. This means that the P-semiconductor 5 is a p-doped P-semiconductor element 30, whereas the N-semiconductor 6 is an n-doped N-semiconductor element 31.

Figure 4:
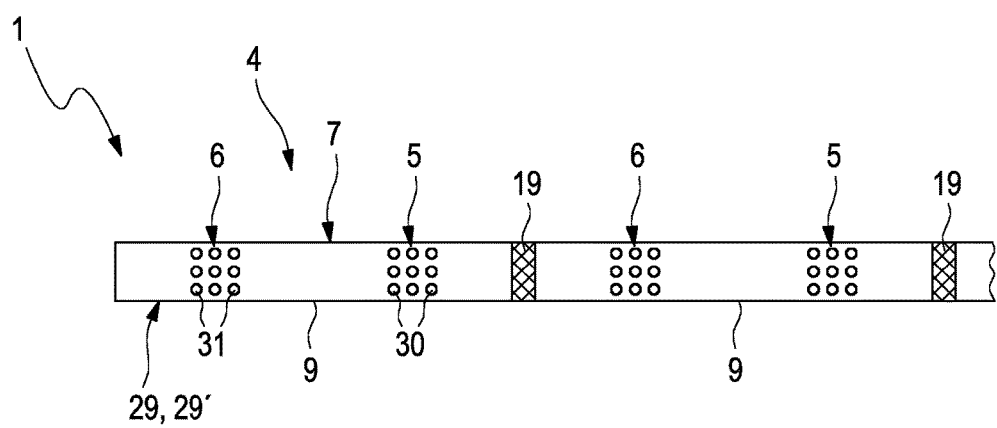
FIG. 4 shows the view from FIG. 3 in the case of a different exemplary embodiment of the connecting structure.

FIG. 4 shows a different exemplary embodiment of the Peltier element 4, which essentially differs from the exemplary embodiment shown in FIG. 3 in that the respective semiconductor 5, 6 has a plurality of such identically doped semiconductor elements 30, 31. This means that the respective P-semiconductor element 5 has a plurality of p-doped P-semiconductor elements 30, in the shown example nine, while the respective N-semiconductor 6 has a plurality of N-semiconductor elements 31, in the shown example nine.

Figure 5:
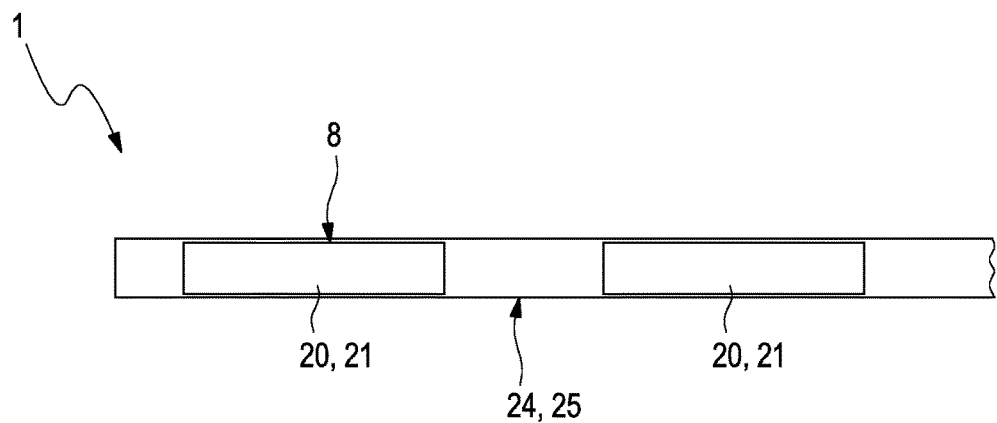
FIG. 5 shows an inner view of the heat exchanger.

FIG. 5 shows a section through the heat exchanger 1, in the case of which a top view onto the fluid channel 24 with the contacting structure 8 can be seen. As follows from FIG. 5, the fluid channel 24 is provided with the contact elements 20 of the contacting structure 8, that is, the contact elements 20 are attached and/or fastened to the fluid channel 24, wherein provision can be made between the contact elements 20 and the fluid channel 24 for such an insulating layer 26, if necessary. The fluid channel 24 is provided with the contact elements 20 for example by an adhesion of the contact elements 20 on the fluid channel 24. The Peltier element 4 can thereby be produced in that the connecting structure 7, which is equipped with the semiconductors 5, 6, is connected to the contact elements 20 and to thus the contact structure 8, in that the semiconductors 5, 6 are electrically contacted with corresponding contact elements 20, in particular soldered to the corresponding contact element 20.

It goes without saying that it is also conceivable to initially attach the semiconductors 5, 6 to the contact elements 20 and to contact them therewith and to subsequently establish an electrical contact between the semiconductors 5, 6 and the corresponding connecting elements 9, and to fasten them to one another, in particular to solder them.

The invention claimed is:

1. A thermoelectric heat exchanger for controlling a temperature of a fluid, comprising:
a flow chamber for communicating a through-flow of a fluid, a temperature of which is to be controlled;
a Peltier element including a plurality of p-doped P-semiconductors and a plurality of n-doped N-semiconductors arranged in an alternating relationship with one another, the plurality of p-doped P-semiconductors and the plurality of n-doped N-semiconductors, on a respective side facing the flow chamber, are electrically contacted by a connecting structure having a plurality of connecting elements, the plurality of connecting elements each electrically contacting a respective P-semiconductor of the plurality of p-doped P-semiconductors and a respective N-semiconductor of the plurality of n-doped N-semiconductors, the plurality of connecting elements being electrically insulated against one another, the plurality of p-doped P-semiconductors and the plurality of n-doped N-semiconductors, on a respective side facing away from the flow chamber, are electrically contacted by a contacting structure having a plurality of contact elements, the plurality of contact elements each electrically contacting a respective P-semiconductor of the plurality of p-doped P-semiconductors and a respective N-semiconductor of the plurality of n-doped N-semiconductors, the plurality of contact elements being electrically insulated against one another;
wherein at least one of the plurality of connecting elements is arranged in the flow chamber; and
wherein the at least one of the plurality of connecting elements arranged in the flow chamber is structured to directly contact the fluid flowing through the at least one of the plurality of connecting elements.

2. The heat exchanger according to claim 1, further comprising a fluid channel through which a temperature-control fluid is flowable and which is fluidically separated from the flow chamber, and wherein the fluid channel is arranged on the respective side of the plurality of p-doped P-semiconductors and the plurality of n-doped N-semiconductors facing away from the flow chamber.

3. The heat exchanger according to claim 1, wherein at least one of the plurality of connecting elements protrudes into the flow chamber.

4. The heat exchanger according to claim 1, wherein at least one of the plurality of connecting elements is a heat exchange element arranged between the fluid and the respective P-semiconductor and the respective N-semiconductor.

5. The heat exchanger according to claim 1, wherein at least one of the plurality of connecting elements is a rib that protrudes into the flow chamber.

6. The heat exchanger according to claim 1, wherein at least one of the plurality of connecting elements abuts flat on at least one of the respective P-semiconductor and the respective N-semiconductor.

7. The heat exchanger according to claim 1, wherein at least two of the plurality of connecting elements are arranged so as to be spaced apart from one another and electrically insulated against one another.

8. The heat exchanger according to claim 1, wherein at least two of the plurality of connecting elements are mechanically connected to one another via an electrically insulating insulating section.

9. The heat exchanger according to claim 8, wherein the insulating section is arranged within the flow chamber and composed of at least one of a plastic and a polymer that is structured elastically to compensate thermal stresses.

10. The heat exchanger according to claim 1, wherein at least one of the plurality of connecting elements is at least partially composed of a metal and structured elastically to compensate thermal stresses.

11. The heat exchanger according to claim 2, wherein at least one of the plurality of contact elements is arranged on a side of the fluid channel facing the flow chamber and is coupled to the fluid channel.

12. The heat exchanger according to claim 11, further comprising an electrically insulating insulating layer arranged between the at least one contact element coupled to the fluid channel and the fluid channel.

13. The heat exchanger according to claim 1, wherein at least two Peltier elements are provided.

14. The heat exchanger according to claim 1, wherein at least one of the plurality of p-doped P-semiconductors and at least one of the plurality of n-doped N-semiconductors has at least two identically doped semiconductor elements.

15. The heat exchanger according to claim 1, wherein the at least one of the plurality of connecting elements includes a base side, two legs arranged at opposing ends of the base side and protruding from the base side away from the contacting structure, and two feet respectively protruding from a respective leg of the two legs.

16. The heat exchanger according to claim 15, wherein:
the base side abuts flat on the respective P-semiconductor and the respective N-semiconductor; and
the two legs extend transversely from the base side and towards one another, and the two feet each extend transversely from the respective leg in a direction away from one another such that the at least one of the plurality of connecting elements has an omega-like shape.

17. The heat exchanger according to claim 12, further comprising a housing including a wall, wherein the flow chamber is defined by the wall and one of the insulating layer and the fluid channel.

18. The heat exchanger according to claim 13, wherein the at least two Peltier elements include a first Peltier element and a second Peltier element;
further comprising two fluid channels including a first fluid channel and a second fluid channel through which a temperature-control fluid is flowable, wherein:
the two fluid channels are fluidically separated from the flow chamber and arranged on opposite sides of the flow chamber, wherein the flow chamber is defined between the two fluid channels;
the first fluid channel is arranged on the respective side facing away from the flow chamber of the plurality of p-doped P-semiconductors and the plurality of n-doped N-semiconductors of the first Peltier element;
the second fluid channel is arranged on the respective side facing away from the flow chamber of the plurality of p-doped P-semiconductors and the plurality of n-doped N-semiconductors of the second Peltier element; and
each of the first Peltier element and the second Peltier element include at least two connecting elements of the plurality of connecting elements that project away from the respective P-semiconductor and the respective N-semiconductor into the flow chamber.

19. The heat exchanger according to claim 18, wherein the at least two of the plurality of connecting elements of the first Peltier element and the at least two of the plurality of connecting elements of the second Peltier element are mechanically connected to one another via a common electrically insulating insulating section arranged within the flow chamber.

* * * * *